(12) United States Patent
Song (10) Patent No.: US 11,903,275 B2
(45) Date of Patent: Feb. 13, 2024

(54) DISPLAY DEVICE WITH SCAN DRIVER HAVING SCAN TRANSISTORS AND SENSING TRANSISTORS

(71) Applicant: Samsung Display Co., Ltd., Yongin-Si (KR)

(72) Inventor: Hyungjin Song, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 378 days.

(21) Appl. No.: 17/381,879

(22) Filed: Jul. 21, 2021

(65) Prior Publication Data

US 2022/0130938 A1 Apr. 28, 2022

(30) Foreign Application Priority Data

Oct. 26, 2020 (KR) ........................ 10-2020-0138863

(51) Int. Cl.
| | | |
|---|---|---|
| *H10K 59/131* | (2023.01) | |
| *G09G 3/3266* | (2016.01) | |
| *H10K 59/121* | (2023.01) | |

(52) U.S. Cl.
CPC ......... *H10K 59/131* (2023.02); *G09G 3/3266* (2013.01); *H10K 59/121* (2023.02)

(58) Field of Classification Search
CPC ... H10K 59/131; H10K 59/121; G09G 3/3266
See application file for complete search history.

(56) References Cited

U.S. PATENT DOCUMENTS

| | | | | |
|---|---|---|---|---|
| 2015/0029171 | A1* | 1/2015 | Jo | G09G 3/3233 345/82 |
| 2016/0104425 | A1* | 4/2016 | Kim | G09G 3/3266 345/80 |
| 2018/0061316 | A1* | 3/2018 | Shin | G09G 3/3275 |
| 2020/0013341 | A1* | 1/2020 | Kim | G09G 3/3266 |
| 2020/0027401 | A1* | 1/2020 | Park | G09G 3/3266 |
| 2020/0184898 | A1* | 6/2020 | Choi | G09G 3/3233 |
| 2020/0219451 | A1* | 7/2020 | Kim | G09G 3/3266 |
| 2020/0243018 | A1* | 7/2020 | Kim | G09G 3/3677 |
| 2020/0372851 | A1* | 11/2020 | Kim | G09G 3/2092 |
| 2021/0065617 | A1* | 3/2021 | Choi | G09G 3/3233 |
| 2021/0104197 | A1 | 4/2021 | Choi et al. | |

FOREIGN PATENT DOCUMENTS

| | | |
|---|---|---|
| JP | 1996-088343 A | 4/1996 |
| KR | 10-2020-0083415 A | 7/2020 |

* cited by examiner

*Primary Examiner* — Lex H Malsawma
(74) *Attorney, Agent, or Firm* — Innovation Counsel LLP (57) ABSTRACT

A display device may include a first scan connection line connecting a first scan line connected to a first pixel and a first scan output transistor, a first sensing connection line connecting a first sensing line connected to the first pixel and a first sensing output transistor, the first sensing connection line crossing and overlapping the first scan connection line, a second sensing connection line connecting a second sensing line connected to a second pixel adjacent to the first pixel in a first direction and a second sensing output transistor, and a second scan connection line connecting a second scan line connected to the second pixel and a second scan output transistor, the second scan connection line crossing and overlapping the second sensing connection line.

20 Claims, 5 Drawing Sheets

DISPLAY DEVICE WITH SCAN DRIVER HAVING SCAN TRANSISTORS AND SENSING TRANSISTORS

CROSS-REFERENCE TO RELATED APPLICATION(S)

This application claims priority under 35 USC § 119 to Korean Patent Application No. 10-2020-0138863 filed on Oct. 26, 2020, in the Korean Intellectual Property Office (KIPO), the entire disclosure of which is incorporated by reference herein.

BACKGROUND

1. Field

Embodiments relate to a display device.

2. Description of the Related Art

A display device may include a plurality of pixels each emitting light. The pixels may be arranged in a matrix form along a pixel row direction and a pixel column direction. Accordingly, a plurality of pixel rows and a plurality of pixel columns may be defined in the display device. The display device may display an image based on the light emitted from the pixels.

When an electrical deviation exists between the pixel rows or between the pixel columns, a visual deviation may be visually recognized in the pixel row direction or the pixel column direction. For example, when a capacitance deviation exists between the pixel rows, line stains or the like may be visually recognized in the pixel row direction.

SUMMARY

Embodiments provide a display device for decreasing a capacitance deviation between pixel rows.

A display device according to an embodiment may include a display including a first pixel, a second pixel, a first scan line, a first sensing line, a second scan line, a second sensing line, a scan driver, a first sensing output transistor, a first scan connection line, a first sensing connection line, a second sensing connection line, and a second scan connection line. The second pixel is adjacent to the first pixel in a first direction. The first scan line and the first sensing line are connected to the first pixel and extend in a second direction crossing the first direction. The second scan line and the second sensing line are connected to the second pixel and extend in the second direction. The scan driver includes a first scan output transistor, a first sensing output transistor, a second sensing output transistor, and a second scan output transistor. The first scan connection line connects the first scan line and the first scan output transistor. The first sensing connection line connects the first sensing line and the first sensing output transistor. The first sensing connection line crosses and overlaps the first scan connection line. The second sensing connection line connects the second sensing line and the second sensing output transistor. The second scan connection line connects the second scan line and the second scan output transistor, the second scan connection line crossing and overlapping the second sensing connection line.

In an embodiment, the first scan line, the first sensing line, the second scan line, and the second sensing line may be disposed in order in the first direction. The first scan output transistor, the first sensing output transistor, the second sensing output transistor, and the second scan output transistor may be disposed in order in the first direction.

In an embodiment, the first scan connection line may include a first scan connection horizontal portion connected to the first scan output transistor and extending in the second direction and a first scan connection vertical portion connecting the first scan connection horizontal portion and the first scan line and extending in the first direction. The first sensing connection line may include a first sensing connection horizontal portion connected to the first sensing output transistor and extending in the second direction and a first sensing connection vertical portion connecting the first sensing connection horizontal portion and the first sensing line and extending in the first direction. The second sensing connection line may include a second sensing connection horizontal portion connected to the second sensing output transistor and extending in the second direction and a second sensing connection vertical portion connecting the second sensing connection horizontal portion and the second sensing line and extending in the first direction. The second scan connection line may include a second scan connection horizontal portion connected to the second scan output transistor and extending in the second direction and a second scan connection vertical portion connecting the second scan connection horizontal portion and the second scan line and extending in the first direction.

In an embodiment, the first scan connection vertical portion may cross and overlap the first sensing connection horizontal portion. The second sensing connection vertical portion may cross and overlap the second scan connection horizontal portion.

In an embodiment, the first scan connection horizontal portion may cross and overlap the first sensing connection vertical portion. The second sensing connection horizontal portion may cross and overlap the second scan connection vertical portion.

In an embodiment, the first scan connection horizontal portion may include a first contact portion crossing and contacting the first scan connection vertical portion and a first overlap portion crossing and overlapping the first sensing connection vertical portion. The first overlap portion may be positioned in the second direction from the first contact portion.

In an embodiment, the first sensing connection horizontal portion may include a second overlap portion crossing and overlapping the first scan connection vertical portion. The second overlap portion may be positioned in the first direction from the first contact portion.

In an embodiment, the first sensing connection horizontal portion may further include a second contact portion crossing and contacting the first sensing connection vertical portion. The second contact portion may be positioned in the first direction from the first overlap portion and positioned in the second direction from the second overlap portion.

In an embodiment, the second sensing connection horizontal portion may include a third contact portion crossing and contacting the second sensing connection vertical portion and a third overlap portion crossing and overlapping the second scan connection vertical portion. The third overlap portion may be positioned in the second direction from the third contact portion.

In an embodiment, the second scan connection horizontal portion may include a fourth overlap portion crossing and overlapping the second sensing connection vertical portion. The fourth overlap portion may be positioned in the first direction from the third contact portion.

In an embodiment, the second scan connection horizontal portion may further include a fourth contact portion crossing and contacting the second scan connection vertical portion. The fourth contact portion may be positioned in the first direction from the third overlap portion and positioned in the second direction from the fourth overlap portion.

In an embodiment, the first scan connection horizontal portion may be disposed on the same layer as the first scan line, and the first sensing connection horizontal portion may be disposed on the same layer as the first sensing line. The second sensing connection horizontal portion may be disposed on the same layer as the second sensing line, and the second scan connection horizontal portion may be disposed on the same layer as the second scan line.

In an embodiment, each of the first pixel and the second pixel may include a lower electrode disposed on a substrate, an active layer disposed on the lower electrode, a gate electrode disposed on the active layer, and a source electrode and a drain electrode connected to the active layer.

In an embodiment, each of the first scan connection horizontal portion, the first sensing connection horizontal portion, the second sensing connection horizontal portion, and the second scan connection horizontal portion may be disposed on the same layer as the source electrode and the drain electrode.

In an embodiment, each of the first scan connection vertical portion, the first sensing connection vertical portion, the second sensing connection vertical portion, and the second scan connection vertical portion may be disposed on the same layer as the lower electrode.

In an embodiment, the first scan connection horizontal portion may directly contact the first scan connection vertical portion, and the first sensing connection horizontal portion may directly contact the first sensing connection vertical portion. The second sensing connection horizontal portion may directly contact the second sensing connection vertical portion, and the second scan connection horizontal portion may directly contact the second scan connection vertical portion.

In an embodiment, the first scan line may directly contact the first scan connection vertical portion, and the first sensing line may directly contact the first sensing connection vertical portion. The second scan line may directly contact the second scan connection vertical portion, and the second sensing line may directly contact the second sensing connection vertical portion.

In an embodiment, a length of the first scan connection vertical portion in the first direction may be substantially equal to a length of the second sensing connection vertical portion in the first direction.

In an embodiment, a length of the first sensing connection vertical portion in the first direction may be substantially equal to a length of the second scan connection vertical portion in the first direction.

In an embodiment, a length of the first scan connection horizontal portion in the second direction, a length of the first sensing connection horizontal portion in the second direction, a length of the second sensing connection horizontal portion in the second direction, and a length of the second scan connection horizontal portion in the second direction may be substantially equal to each other.

In the display device according to the embodiments, the first scan connection line may cross and overlap the first sensing connection line, and the second sensing connection line may cross and overlap the second scan connection line. In this manner, a capacitance deviation between a first pixel row in which the first pixel is disposed and a second pixel row in which the second pixel is disposed may decrease, or the capacitance deviation between the first pixel row and the second pixel row may not substantially occur.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, display devices in accordance with embodiments will be explained in detail with reference to the accompanying drawings.

Figure 1:
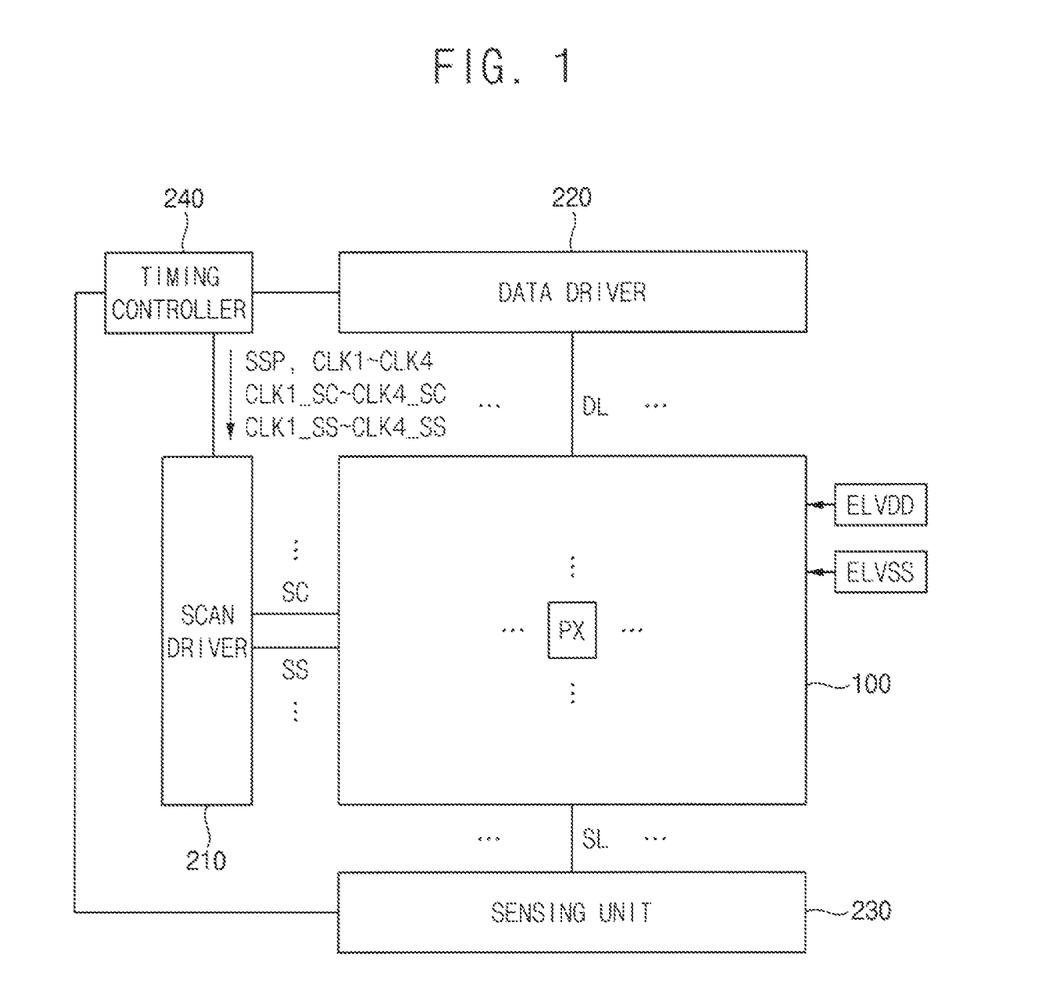
FIG. 1 is a block diagram illustrating a display device according to an embodiment.

FIG. 1 is a block diagram illustrating a display device according to an embodiment.

Referring to FIG. 1, a display device according to an embodiment may include a display 100, e.g., a display unit, or a display panel, a scan driver 210, a data driver 220, a sensing unit 230, and a timing controller 240.

The display 100 may include a plurality of pixels PX. The pixels PX may be connected to data lines DL, scan lines SC, sensing lines SS, and initialization lines SL.

The pixels PX may receive a first power voltage from a first power source ELVDD, and may receive a second power voltage from a second power source ELVSS. Each of the pixels PX may receive a data signal from the data line DL when the scan signal is supplied from the scan line SC. The pixel PX receiving the data signal may control an amount of current flowing from the first power source ELVDD to the second power source ELVSS through a light emitting element in response to the data signal. In this case, the light emitting element may generate light of a predetermined luminance in response to the amount of current. In an embodiment, the first power voltage may be greater than the second power voltage.

The scan driver 210 may output the scan signal in response to a scan control signal. The scan driver 210 may sequentially supply the scan signal to the scan lines SC. Here, the scan signal may be set as a gate-on voltage, e.g., a voltage of a predetermined high level, such that a transistor included in each of the pixels PX is turned on.

The scan driver 210 may output a sensing signal in response to the scan control signal. The scan driver 210 may supply the sensing signal to at least one sensing line among the sensing lines SS. Here, the sensing signal may be set as a gate-on voltage, e.g., a voltage of a predetermined high level, such that a transistor included in each of the pixels PX is turned on.

The data driver 220 may supply the data signal to the data lines DL in response to a data control signal. The data signal supplied to the data lines DL may be supplied to the pixels PX to which the scan signal is supplied.

The sensing unit 230 may supply an initialization voltage through the initialization lines SL to the pixels PX to which the sensing signal is supplied, and may measure deterioration information of each of the pixels PX. In an embodiment, as illustrated in FIG. 1, the sensing unit 230 may be a separate element from the data driver 220. In an embodiment, the sensing unit 230 may be included in the data driver 220.

The timing controller 240 may generate the scan control signal and the data control signal based on signals input from the outside. The scan control signal may be supplied to the scan driver 210, and the data control signal may be supplied to the data driver 220.

The scan control signal may include a plurality of clock signals CLK1 to CLK4, CLK1_SC to CLK4_SC, and CLK1_SS to CLK4_SS and a scan start signal SSP. More particularly, the clock signals CLK1 to CLK4, CLK1_SC to CLK4_SC, and CLK1_SS to CLK4_SS supplied to the scan driver 210 may include first to fourth clock signals CLK1 to CLK4, first to fourth scan clock signals CLK1_SC to CLK4_SC, and first to fourth sensing clock signals CLK1_SS to CLK4_SS. The scan start signal SSP may control an output timing of a first scan signal.

The first to fourth clock signals CLK1 to CLK4 may be used to shift the scan start signal SSP. The first to fourth scan clock signals CLK1_SC to CLK4_SC may be used to output the scan signal in response to the scan start signal SSP and at least one of the first to fourth clock signals CLK1 to CLK4. The first to fourth sensing clock signals CLK1_SS to CLK4_SS may be used to output the sensing signal in response to the scan start signal SSP and at least one of the first to fourth clock signals CLK1 to CLK4. Further, the scan driver 210 may further receive clock signals other than the above-described clock signals CLK1 to CLK4, CLK1_SC to CLK4_SC, and CLK1_SS to CLK4_SS.

The data control signal may include a source start pulse and a plurality of clock signals. The source start pulse may control a sampling start point of the data signal, and the clock signals may be used to control a sampling operation.

Figure 2:
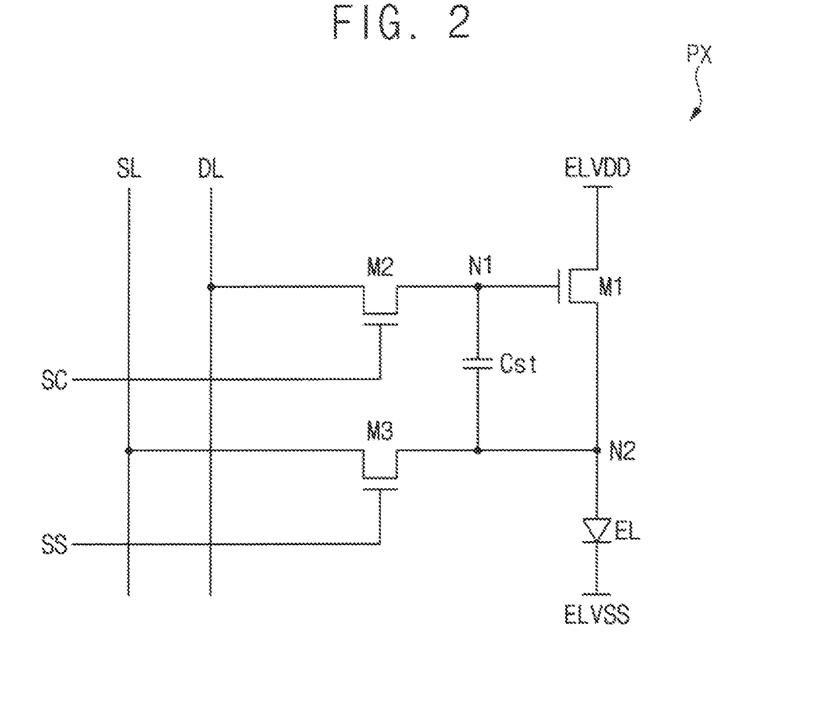
FIG. 2 is a circuit diagram illustrating a pixel in FIG. 1.

FIG. 2 is a circuit diagram illustrating the pixel PX in FIG. 1.

Referring to FIG. 2, the pixel PX may include a driving transistor M1, a switching transistor M2, a sensing transistor M3, a storage capacitor Cst, and a light emitting element EL.

The switching transistor M2 may include a first electrode connected to the data line DL, a second electrode connected to a first node N1, and a gate electrode connected to the scan line SC. The switching transistor M2 may be turned on when the scan signal is supplied from the scan line SC, and may supply the data signal receiving from the data line DL to the storage capacitor Cst. Further, the switching transistor M2 may control a voltage of the first node N1.

The driving transistor M1 may include a first electrode connected to the first power source ELVDD, a second electrode connected to a second node N2, and a gate electrode connected to the first node N1. The driving transistor M1 may control an amount of current flowing through the light emitting element EL in response to a voltage between the gate electrode and the second electrode.

The sensing transistor M3 may include a first electrode connected to the initialization line SL, a second electrode connected to the second node N2, and a gate electrode connected to the sensing line SS. The sensing transistor M3 may be turned on when the sensing signal is supplied from the sensing line SS, thus controlling a voltage of the second node N2. Further, the sensing transistor M3 may be turned on when the sensing signal is supplied from the sensing line SS, thus measuring the current flowing through the light emitting element EL.

The storage capacitor Cst may include a first electrode connected to the first node N1 and a second electrode connected to the second node N2. The storage capacitor Cst may charge a voltage corresponding to the data signal.

The light emitting element EL may include a first electrode connected to the second node N2 and a second electrode connected to the second power source ELVSS. The light emitting element EL may generate light corresponding to the amount of current supplied from the driving transistor M1.

In FIG. 2, the first electrode of each of the transistors M1, M2, and M3 may be one of a source electrode and a drain electrode, and the second electrode of each of the transistors M1, M2, and M3 may be a different electrode from the first electrode. For example, the first electrode may be the drain electrode, and the second electrode may be the source electrode.

In an embodiment, as illustrated in FIG. 2, each of the transistors M1, M2, and M3 may be an NMOS transistor. However, in an embodiment, each of the transistors M1, M2, and M3 may be a PMOS transistor.

In an embodiment, while sensing the mobility of the driving transistor M1, an activated scan signal may be supplied to the scan line SC and an activated sensing signal may be supplied to the sensing line SS. However, in order to sense the current flowing through the light emitting element EL and obtain deterioration information of the light emitting element EL, the driving transistor M1 may be turned off and the sensing transistor M3 may be turned on. In other words, while detecting the current flowing through the light emitting element EL, an inactivated signal may be applied to the scan line SC, and an activated signal may be applied to the sensing line SS. Accordingly, the scan signal supplied to the scan line SC and the sensing signal supplied to the sensing line SS may be separately supplied.

Figure 3:
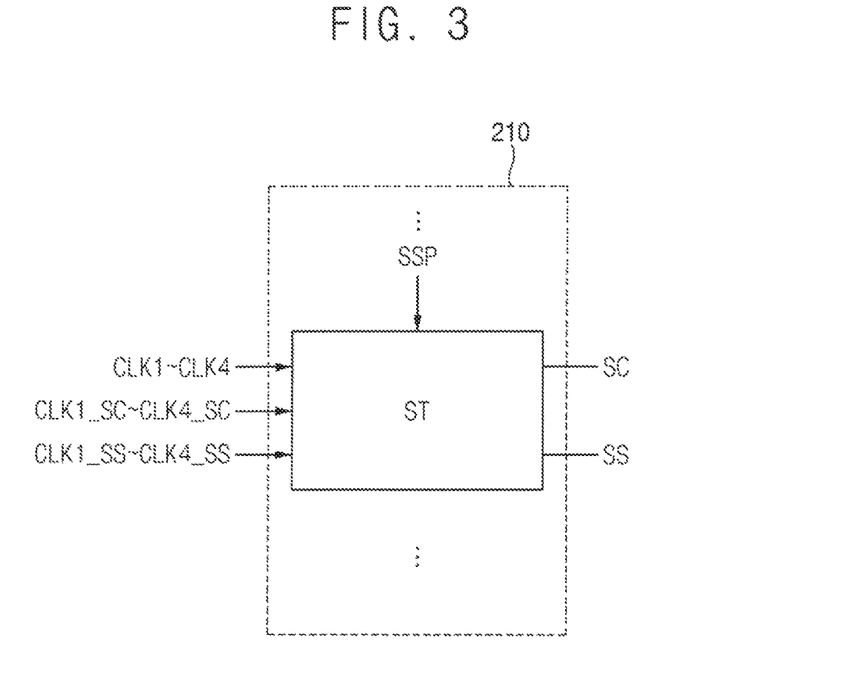
FIG. 3 is a block diagram illustrating a scan driver in FIG. 1.

FIG. 3 is a block diagram illustrating the scan driver 210 in FIG. 1.

Referring to FIGS. 1 and 3, the scan driver 210 may include a plurality of stages ST. The scan driver 210 may supply the scan signal to the scan lines SC such that the display 100 may display an image. Further, the scan driver 210 may supply the sensing signal to the sensing lines SS such that the display 100 may perform a mobility sensing operation and a deterioration sensing operation of the light emitting element EL in FIG. 2.

The stages ST may be sequentially connected, and one scan line SC and one sensing line SS may be connected to each of the stages ST. Each of the stages ST may receive at least two clock signals among the first to fourth clock signals CLK1 to CLK4, at least one scan clock signal among the first to fourth scan clock signals CLK1_SC to CLK4_SC, and at least one sensing clock signal among the first to fourth sensing clock signals CLK1_SS to CLK4_SS.

For example, a first stage ST may receive the first and third clock signals CLK1 and CLK3, the first scan clock signal CLK1_SC, the first sensing clock signal CLK1_SS, and the scan start signal SSP, and may be connected to a first scan line SC and a first sensing line SS. A second stage ST may be connected to the first stage ST, may receive the second and fourth clock signals CLK2 and CLK4, the second scan clock signal CLK2_SC, the second sensing clock signal CLK2_SS, and a scan signal output from the first stage ST. The second stage ST may be connected to a second scan line SC and a second sensing line SS. Further, an n-th stage ST may be connected to an (n−1)-th stage ST, may receive the second and fourth clock signals CLK2 and CLK4, the fourth scan clock signal CLK4_SC, and the fourth sensing clock signal CLK4_SS, and a scan signal output from the (n−1)-th stage ST. The n-th stage ST may be connected to an n-th scan line SC and a n-th sensing line SS.

When the display 100 performs an operation of displaying an image, the scan driver 210 may sequentially apply the scan signal to the first to n-th scan lines SC in response to the scan start signal SSP. For example, the second stage ST may output the scan signal after the first stage ST outputs the scan signal, a third stage ST may output the scan signal after the second stage ST outputs the scan signal, and the n-th stage ST may output the scan signal after the (n−1)-th stage ST outputs the scan signal.

When the display 100 performs an operation of sensing the mobility or the deterioration of the light emitting element EL, the scan driver 210 may select a sensing line SS on which the sensing operation is to be performed, and may output the sensing signal to the selected sensing line SS.

In other words, the scan driver 210 may sequentially apply the scan signal to the scan lines SC in a display period of one frame, and may apply the sensing signal to at least one of the sensing lines SS in the display period of the one frame.

Figure 4:
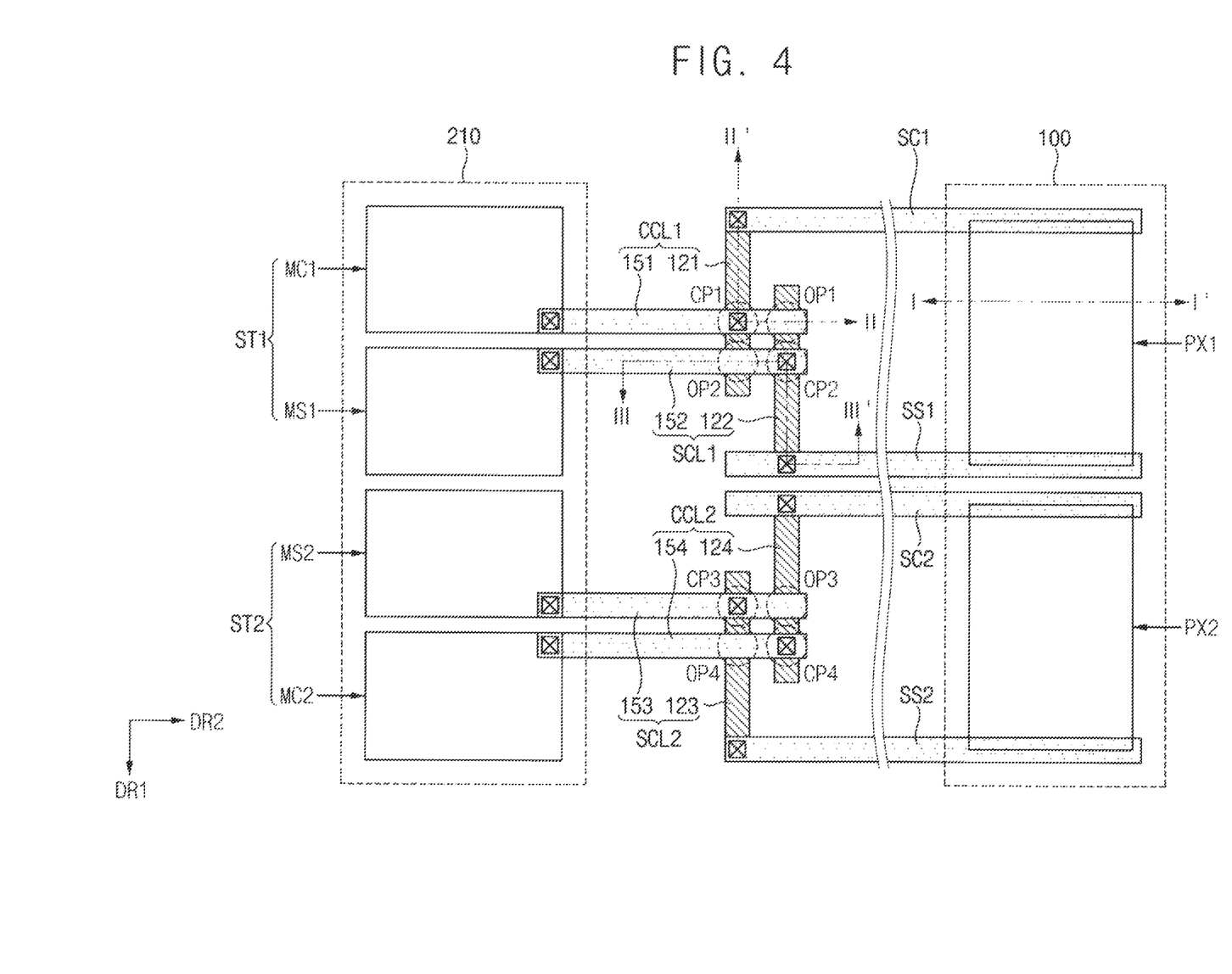
FIG. 4 is a plan view illustrating a portion between a display region and the scan driver in FIG. 1.

FIG. 4 is a plan view illustrating a portion between the display 100 and the scan driver 210 in FIG. 1.

Referring to FIGS. 1 and 4, the display 100 may include a first pixel PX1, a second pixel PX2, a first scan line SC1, a first sensing line SS1, a second scan line SC2, and a second sensing line SS2. The second pixel PX2 may be adjacent to the first pixel PX1 in a first direction DR1. For example, the first pixel PX1 may be included in an n-th pixel row, and the second pixel PX2 may be included in an (n+1)-th pixel row.

In an embodiment, the first pixel PX1 may be included in an odd pixel row, and the second pixel PX2 may be included in an even pixel row. However, in an embodiment, the first pixel PX1 may be included in the even pixel row, and the second pixel PX2 may be included in the odd pixel row.

Each of the first scan line SC1 and the first sensing line SS1 may be connected to the first pixel PX1, and may extend in a second direction DR2 crossing the first direction DR1. The first sensing line SS1 may be disposed in the first direction DR1 from the first scan line SC1. The first scan line SC1 may provide a first scan signal to the first pixel PX1, and the first sensing line SS1 may provide a first sensing signal to the first pixel PX1.

Each of the second scan line SC2 and the second sensing line SS2 may be connected to the second pixel PX2, and may extend in the second direction DR2. The second sensing line SS2 may be disposed in the first direction DR1 from the second scan line SC2. The second scan line SC2 may provide a second scan signal to the second pixel PX2, and the second sensing line SS2 may provide a second sensing signal to the second pixel PX2.

The scan driver 210 may include a first stage ST1 and a second stage ST2. The second stage ST2 may be adjacent to the first stage ST1 in the first direction DR1. The first stage ST1 may provide the first scan signal and the first sensing signal to the first pixel PX1. The second stage ST2 may provide the second scan signal and the second sensing signal to the second pixel PX2.

The first stage ST1 may include a first scan output transistor MC1 and a first sensing output transistor MS1. The first scan output transistor MC1 may provide the first scan signal to the first scan line SC1, and the first sensing output transistor MS1 may provide the first sensing signal to the first sensing line SS1.

The second stage ST2 may include a second sensing output transistor MS2 and a second scan output transistor MC2. The second sensing output transistor MS2 may provide the second sensing signal to the second sensing line SS2, and the second scan output transistor MC2 may provide the second scan signal to the second scan line SC2.

In an embodiment, the first scan line SC1, the first sensing line SS1, the second scan line SC2, and the second sensing line SS2 may be disposed in order in the first direction DR1. The first scan output transistor MC1, the first sensing output transistor MS1, the second sensing output transistor MS2, and the second scan output transistor MC2 may be disposed in order in the first direction DR1. The first sensing line SS1 and the first sensing output transistor MS1 are disposed in the first direction DR1 from the first scan line SC1 and the first scan output transistor MC1, respectively. However, the second sensing line SS2 may be disposed in the first direction DR1 from the second scan line SC2, and the second sensing output transistor MS2 may be disposed in a direction opposite to the first direction DR1 from the second scan output transistor MC2. In other words, the first scan output transistor MC1 may be disposed in the same row as the first scan line SC1, and the first sensing output transistor MS1 may be disposed in the same row as the first sensing line SS1. However, the second scan output transistor MC2 may be disposed in the same row as the second sensing line SS2, and the second sensing output transistor MS2 may be disposed in the same row as the second scan line SC2.

The display device may include a first scan connection line CCL1, a first sensing connection line SCL1, a second sensing connection line SCL2, and a second scan connection line CCL2 disposed between the display 100 and the scan driver 210. The first scan connection line CCL1 may connect the first scan line SC1 and the first scan output transistor MC1. The first sensing connection line SCL1 may connect the first sensing line SS1 and the first sensing output transistor MS1. The second sensing connection line SCL2 may connect the second sensing line SS2 and the second sensing output transistor MS2. The second scan connection line CCL2 may connect the second scan line SC2 and the second scan output transistor MC2.

The first scan connection line CCL1 may cross and overlap the first sensing connection line SCL1, and the second sensing connection line SCL2 may cross and overlap the second scan connection line CCL2. As the first scan connection line CCL1 crosses and overlaps the first sensing connection line SCL1, a capacitor may be formed in a portion where the first scan connection line CCL1 overlaps the first sensing connection line SCL1. Further, as the second sensing connection line SCL2 crosses and overlaps the second scan connection line CCL2, a capacitor is formed in a portion where the second sensing connection line SCL2 overlaps the second scan connection line CCL2.

In the prior art, since the first scan output transistor MC1 is disposed in the same row as the first scan line SC1 and the first sensing output transistor MS1 is disposed in the same row as the first sensing line SS1, the first scan connection line may not cross the first sensing connection line. Further, since the second scan output transistor MC2 is disposed in a different row as the second scan line SC2 and the second sensing output transistor MS2 is disposed in a different row as the second sensing line SS2, the second scan connection line may cross and overlap the second sensing connection line. In the prior art, a capacitor is not formed between the first scan connection line and the first sensing connection line. However, a capacitor may be formed between the second scan connection line and the second sensing connection line. Accordingly, a capacitance deviation between pixel rows may occur, and a horizontal line defect may be visually recognized.

However, in the embodiments, the first scan connection line CCL1 may cross and overlap the first sensing connection line SCL1, and the second sensing connection line SCL2 may cross and overlap the second scan connection line CCL2, so that a capacitor may be formed between the first scan connection line CCL1 and the first sensing connection line SCL1, and a same or similar capacitor may also be formed between the second scan connection line CCL2 and the second sensing connection line SCL2. Accordingly, a capacitance deviation between pixel rows may decrease or may not substantially occur, and a horizontal line defect may not be visually recognized.

In an embodiment, the first scan connection line CCL1 may include a first scan connection horizontal portion 151 and a first scan connection vertical portion 121. The first sensing connection line SCL1 may include a first sensing connection horizontal portion 152 and a first sensing connection vertical portion 122. The first scan connection horizontal portion 151 may be connected to the first scan output transistor MC1, and may extend in the second direction DR2. The first scan connection vertical portion 121 may connect the first scan connection horizontal portion 151 and the first scan line SC1, and may extend in the first direction DR1. The first sensing connection horizontal portion 152 may be connected to the first sensing output transistor MS1, and may extend in the second direction DR2. The first sensing connection vertical portion 122 may connect the first sensing connection horizontal portion 152 and the first sensing line SS1, and may extend in the first direction DR1.

In an embodiment, the first scan connection vertical portion 121 may cross and overlap the first sensing connection horizontal portion 152, and the first scan connection horizontal portion 151 may cross and overlap the first sensing connection vertical portion 122. The first scan connection vertical portion 121 may be insulated from the first sensing connection horizontal portion 152, and the first scan connection horizontal portion 151 may be insulated from the first sensing connection vertical portion 122.

In an embodiment, the first scan connection horizontal portion 151 may include a first contact portion CP1 crossing and contacting the first scan connection vertical portion 121 and a first overlap portion OP1 crossing and overlapping the first sensing connection vertical portion 122. The first contact portion CP1 may contact the first scan connection vertical portion 121 through a contact hole. The first overlap portion OP1 may be insulated from the first sensing connection vertical portion 122. The first overlap portion OP1 may be positioned in the second direction DR2 from the first contact portion CP1.

In an embodiment, the first sensing connection horizontal portion 152 may include a second overlap portion OP2 crossing and overlapping the first scan connection vertical portion 121 and a second contact portion CP2 crossing and contacting the first sensing connection vertical portion 122. The second overlap portion OP2 may be insulated from the first scan connection vertical portion 121. The second contact portion CP2 may contact the first sensing connection vertical portion 122 through a contact hole. The second overlap portion OP2 may be positioned in the first direction DR1 from the first contact portion CP1. The second contact portion CP2 may be positioned in the first direction DR1 from the first overlap portion OP1, and may be positioned in the second direction DR2 from the second overlap portion OP2.

In an embodiment, the second sensing connection line SCL2 may include a second sensing connection horizontal portion 153 and a second sensing connection vertical portion 123. The second scan connection line CCL2 may include a second scan connection horizontal portion 154 and a second scan connection vertical portion 124. The second sensing connection horizontal portion 153 may be connected to the second sensing output transistor MS2, and may extend in the second direction DR2. The second sensing connection vertical portion 123 may connect the second sensing connection horizontal portion 153 and the second sensing line SS2, and may extend in the first direction DR1. The second scan connection horizontal portion 154 may be connected to the second scan output transistor MC2, and may extend in the second direction DR2. The second scan connection vertical portion 124 may connect the second scan connection horizontal portion 154 and the second scan line SC2, and may extend in the first direction DR1.

In an embodiment, the second sensing connection vertical portion 123 may cross and overlap the second scan connection horizontal portion 154, and the second sensing connection horizontal portion 153 may cross and overlap the second scan connection vertical portion 124. The second sensing connection vertical portion 123 may be insulated from the second scan connection horizontal portion 154, and the second sensing connection horizontal portion 153 may be insulated from the second scan connection vertical portion 124.

In an embodiment, the second sensing connection horizontal portion 153 may include a third contact portion CP3 crossing and contacting the second sensing connection vertical portion 123 and a third overlap portion OP3 crossing and overlapping the second scan connection vertical portion 124. The third contact portion CP3 may contact the second sensing connection vertical portion 123 through a contact hole. The third overlap portion OP3 may be insulated from the second scan connection vertical portion 124. The third overlap portion OP3 may be positioned in the second direction DR2 from the third contact portion CP3.

In an embodiment, the second scan connection horizontal portion 154 may include a fourth overlap portion OP4 crossing and overlapping the second sensing connection vertical portion 123 and a fourth contact portion CP4 crossing and contacting the second scan connection vertical portion 124. The fourth overlap portion OP4 may be insulated from the second sensing connection vertical portion 123. The fourth contact portion CP4 may contact the second scan connection vertical portion 124 through a contact hole. The fourth overlap portion OP4 may be positioned in the first direction DR1 from the third contact portion CP3. The fourth contact portion CP4 may be positioned in the first direction DR1 from the third overlap portion OP3, and may be positioned in the second direction DR2 from the fourth overlap portion OP4.

In an embodiment, a length of the first scan connection vertical portion 121 in the first direction DR1 may be substantially equal to a length of the second sensing connection vertical portion 123 in the first direction DR1.

In an embodiment, a length of the first sensing connection vertical portion 122 in the first direction DR1 may be substantially equal to a length of the second scan connection vertical portion 124 in the first direction DR1.

In an embodiment, a length of the first scan connection horizontal portion 151 in the second direction DR2, a length of the first sensing connection horizontal portion 152 in the second direction DR2, a length of the second sensing connection horizontal portion 153 in the second direction DR2, and a length of the second scan connection horizontal portion 154 in the second direction DR2 may be substantially equal to each other.

Figure 5:
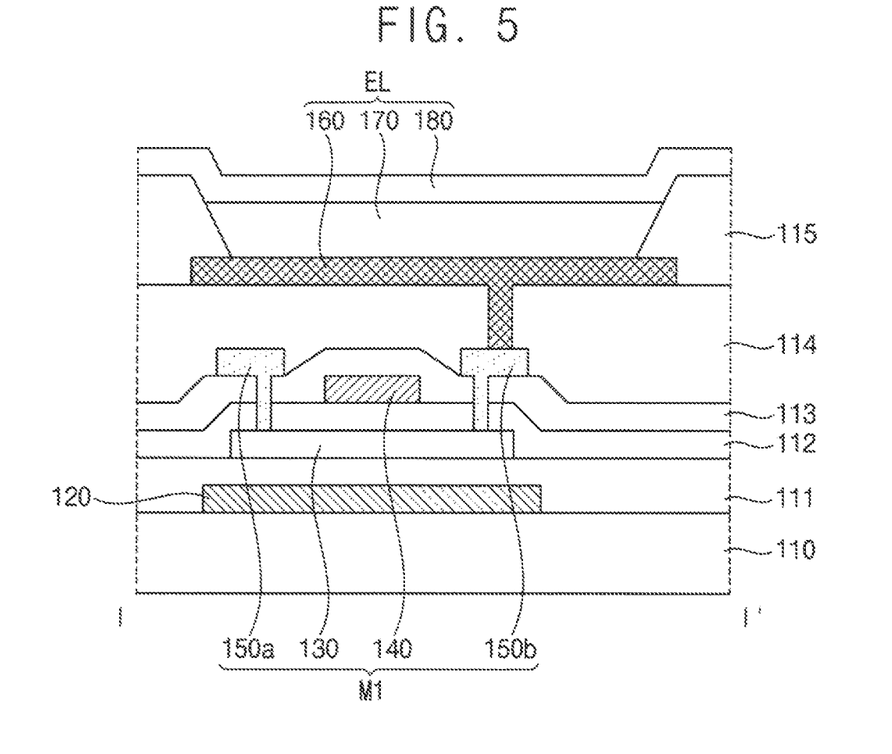
FIG. 5 is a cross-sectional view illustrating the display device taken along a line I-I' in FIG. 4.
Figure 6:
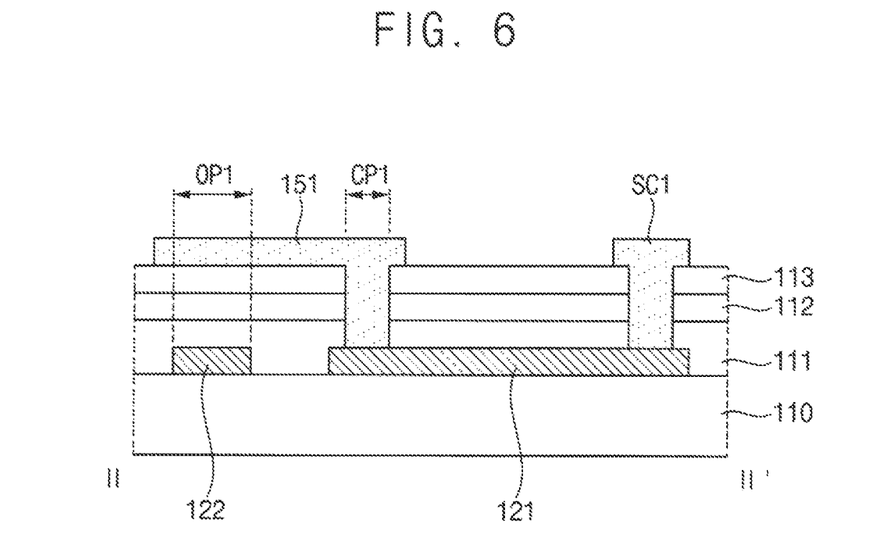
FIG. 6 is a cross-sectional view illustrating the display device taken along a line II-II' in FIG. 4.
Figure 7:
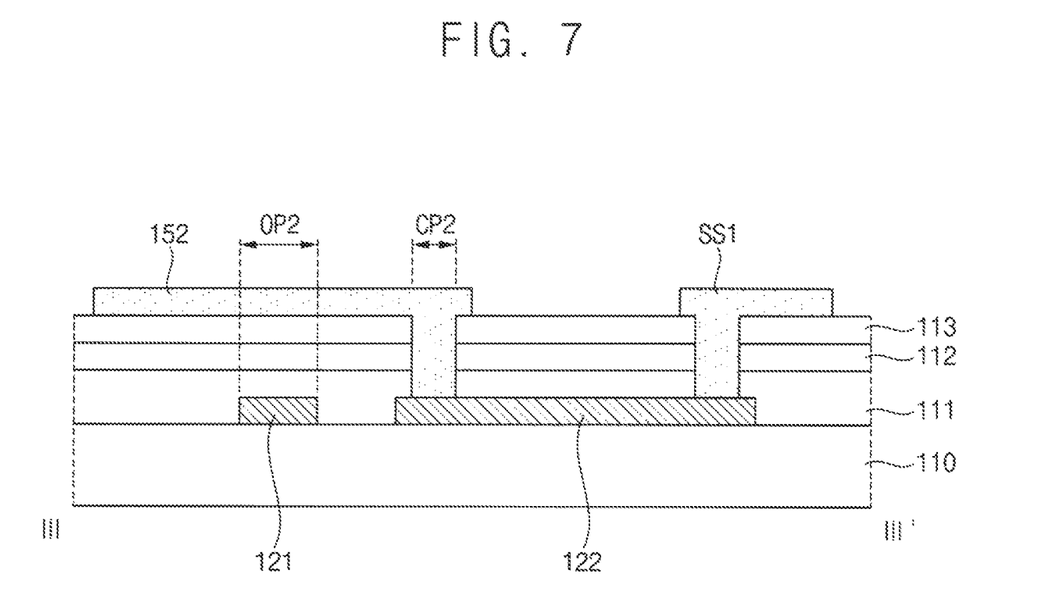
FIG. 7 is a cross-sectional view illustrating the display device taken along a line III-III' in FIG. 4.

FIG. 5 is a cross-sectional view illustrating the display device taken along a line I-I' in FIG. 4. FIG. 6 is a cross-sectional view illustrating the display device taken along a line II-II' in FIG. 4. FIG. 7 is a cross-sectional view illustrating the display device taken along a line III-III' in FIG. 4.

Referring to FIGS. 4, 5, 6, and 7, each of the first pixel PX1 and the second pixel PX2 may include a substrate 110, a lower electrode 120, a buffer layer 111, an active layer 130, a gate insulation layer 112, a gate electrode 140, an insulation interlayer 113, a drain electrode 150a, a source electrode 150b, a planarization layer 114, a first electrode 160, a pixel defining layer 115, an emission layer 170, and a second electrode 180.

The substrate 110 may be a transparent insulation substrate. In an embodiment, the substrate 110 may have a rigid characteristic. In such an embodiment, the substrate 110 may include, for example, glass, quartz, metal, or the like. In an embodiment, the substrate 110 may have a flexible characteristic. In such an embodiment, the substrate 110 may include, for example, a polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulose acetate propionate (CAP), or the like.

The lower electrode 120 may be disposed on the substrate 110. The lower electrode 120 may include a conductive material such as molybdenum (Mo), copper (Cu), aluminum (Al), titanium (Ti), or the like. The lower electrode 120 may block external light. Accordingly, the lower electrode 120 may prevent the external light from being incident onto the active layer 130.

The buffer layer 111 may be disposed on the lower electrode 120. The buffer layer 111 may cover the lower electrode 120 on the substrate 110. The buffer layer 111 may prevent impurities from flowing through the substrate 110. Further, the buffer layer 111 may provide a flat upper surface over the substrate 110. The buffer layer 111 may include an inorganic insulation material such as silicon nitride, silicon oxide, silicon oxynitride, or the like.

The active layer 130 may be disposed on the buffer layer 111. The active layer 130 may overlap the lower electrode 120. In an embodiment, the active layer 130 may include amorphous silicon, polycrystalline silicon, or the like. In an embodiment, the active layer 130 may include an oxide semiconductor. For example, the oxide semiconductor may include an oxide of at least one of indium (In), gallium (Ga), zinc (Zn), tin (Sn), titanium (Ti), zirconium (Zr), and hafnium (Hf).

The gate insulation layer 112 may be disposed on the active layer 130. The gate insulation layer 112 may cover the active layer 130 on the buffer layer 111. In an embodiment, the gate insulation layer 112 may have a uniform thickness along the profile of the active layer 130. In an embodiment, the gate insulation layer 112 may have a flat upper surface. The gate insulation layer 112 may include an inorganic insulation material such as silicon nitride, silicon oxide, silicon oxynitride, or the like.

The gate electrode 140 may be disposed on the gate insulation layer 112. The gate electrode 140 may overlap the active layer 130. The gate electrode 140 may include a conductive material such as molybdenum (Mo), copper (Cu), aluminum (Al), titanium (Ti), or the like.

The insulation interlayer 113 may be disposed on the gate electrode 140. The insulation interlayer 113 may cover the gate electrode 140 on the gate insulation layer 112. In an embodiment, the insulation interlayer 113 may have a uniform thickness along the profiles of the gate insulation layer 112 and the gate electrode 140. In an embodiment, the insulation interlayer 113 may have a flat upper surface. The insulation interlayer 113 may include an inorganic insulation material such as silicon nitride, silicon oxide, silicon oxynitride, or the like.

The drain electrode 150a and the source electrode 150b may be disposed on the insulation interlayer 113. Each of the drain electrode 150a and the source electrode 150b may be connected to the active layer 130 through a contact hole formed in the gate insulation layer 112 and the insulation interlayer 113. Each of the drain electrode 150a and the source electrode 150b may include a conductive material such as molybdenum (Mo), copper (Cu), aluminum (Al), titanium (Ti), or the like. In an embodiment, the active layer 130, the gate electrode 140, the drain electrode 150a, and the source electrode 150b may form the driving transistor M1.

The planarization layer 114 may be disposed on the drain electrode 150a and the source electrode 150b. The planarization layer 114 may cover the drain electrode 150a and the source electrode 150b on the insulation interlayer 113. The planarization layer 114 may have a flat upper surface. The planarization layer 114 may include an organic insulation material such as polyimide (PI) or the like.

The first electrode 160 may be disposed on the planarization layer 114. The first electrode 160 may be connected to the drain electrode 150a or the source electrode 150b through a contact hole formed in the planarization layer 114. In an embodiment, as illustrated in FIG. 5, the first electrode 160 may be connected to the source electrode 150b. However, in an embodiment, the first electrode 160 may be connected to the drain electrode 150a. The first electrode 160 may include a conductive material such as a metal, an alloy, a transparent conductive oxide, or the like. In an embodiment, the first electrode 160 may include silver (Ag) and indium tin oxide (ITO).

The pixel defining layer 115 may be disposed on the first electrode 160. The pixel defining layer 115 may partially cover the first electrode 160 on the planarization layer 114. The pixel defining layer 115 may have a pixel opening exposing at least a portion of the first electrode 160. In an embodiment, the pixel opening may expose a central portion of the first electrode 160, and the pixel defining layer 115 may cover a peripheral portion of the first electrode 160. The pixel defining layer 115 may have a flat upper surface. The pixel defining layer 115 may include an organic insulation material such as polyimide (PI) or the like.

The emission layer 170 may be disposed on the first electrode 160. The emission layer 170 may be disposed on the first electrode 160 exposed by the pixel opening. The emission layer 170 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, or the like. The high molecular weight organic compound may include poly(3,4-ethylenedioxythiophene), polyaniline, poly-phenylenevinylene, polyfluorene, or the like.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor properties by preventing chemical modification of the core, and as a charging layer for imparting electrophoretic properties to the quantum dots.

The second electrode 180 may be disposed on the emission layer 170. In an embodiment, the second electrode 180 may also be disposed on the pixel defining layer 115. The second electrode 180 may include a conductive material such as a metal, an alloy, a transparent conductive oxide, or the like. For example, the conductive material may include aluminum (Al), platinum (Pt), silver (Ag), magnesium (Mg), gold (Au), chromium (Cr), tungsten (W), titanium (Ti), or the like. The first electrode 160, the emission layer 170, and the second electrode 180 may form the light emitting element EL.

In an embodiment, the first scan connection horizontal portion 151 may be disposed on the same layer as the first scan line SC1, and the first sensing connection horizontal portion 152 may be disposed on the same layer as the first sensing line SS1. Further, the second sensing connection horizontal portion 153 may be disposed on the same layer as the second sensing line SS2, and the second scan connection horizontal portion 154 may be disposed on the same layer as the second scan line SC2.

In an embodiment, each of the first scan connection horizontal portion 151, the first sensing connection horizontal portion 152, the second sensing connection horizontal portion 153, and the second scan connection horizontal portion 154 may be disposed on the same layer as the drain electrode 150a and the source electrode 150b. For example, each of the first scan connection horizontal portion 151, the first sensing connection horizontal portion 152, the second sensing connection horizontal portion 153, and the second scan connection horizontal portion 154 may be disposed on the upper surface of the insulation interlayer 113.

In an embodiment, each of the first scan connection vertical portion 121, the second sensing connection vertical portion 122, the second sensing connection vertical portion 123, and the second scan connection vertical portion 124 may be disposed on the same layer as the lower electrode 120. For example, each of the first scan connection vertical portion 121, the second sensing connection vertical portion 122, the second sensing connection vertical portion 123, and the second scan connection vertical portion 124 may be disposed between the substrate 110 and the buffer layer 111.

In an embodiment, the first scan connection horizontal portion 151 may directly contact the first scan connection vertical portion 121, and the first sensing connection horizontal portion 152 may directly contact the first sensing connection vertical portion 122. Further, the second sensing connection horizontal portion 153 may directly contact the second sensing connection vertical portion 123, and the second scan connection horizontal portion 154 may directly contact the second scan connection vertical portion 124. For example, the first scan connection horizontal portion 151, the first sensing connection horizontal portion 152, the second sensing connection horizontal portion 153, and the second scan connection horizontal portion 154 may directly contact the first scan connection vertical portion 121, the first sensing connection vertical portion 122, the second sensing connection vertical portion 123, and the second scan connection vertical portion 124, respectively, through contact holes formed in the buffer layer 111, the gate insulation layer 112, and the insulation interlayer 113.

In an embodiment, the first scan line SC1 may directly contact the first scan connection vertical portion 121, and the first sensing line SS1 may directly contact the first sensing connection vertical portion 122. Further, the second scan line SC2 may directly contact the second scan connection vertical portion 124, and the second sensing line SS2 may directly contact the second sensing connection vertical portion 123. For example, the first scan line SC1, the first sensing line SS1, the second scan line SC2, and the second sensing line SS2 may directly contact the first scan connection vertical portion 121, the first sensing connection vertical portion 122, the second scan connection vertical portion 124, and the second sensing connection vertical portion 123, respectively, through contact holes formed in the buffer layer 111, the gate insulation layer 112, and the insulation interlayer 113.

The display device according to the embodiments may be applied for a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device, comprising:
   a display including a first pixel, a second pixel adjacent to the first pixel in a first direction, a first scan line and a first sensing line connected to the first pixel and extending in a second direction crossing the first direction, and a second scan line and a second sensing line connected to the second pixel and extending in the second direction;
   a scan driver including a first scan output transistor, a first sensing output transistor, a second sensing output transistor, and a second scan output transistor;
   a first scan connection line connecting the first scan line and the first scan output transistor;
   a first sensing connection line connecting the first sensing line and the first sensing output transistor, the first sensing connection line crossing and overlapping the first scan connection line;
   a second sensing connection line connecting the second sensing line and the second sensing output transistor; and
   a second scan connection line connecting the second scan line and the second scan output transistor, the second scan connection line crossing and overlapping the second sensing connection line.

2. The display device of claim 1, wherein the first scan line, the first sensing line, the second scan line, and the second sensing line are disposed in order in the first direction, and
   wherein the first scan output transistor, the first sensing output transistor, the second sensing output transistor, and the second scan output transistor are disposed in order in the first direction.

3. The display device of claim 1, wherein the first scan connection line includes a first scan connection horizontal portion connected to the first scan output transistor and extending in the second direction and a first scan connection vertical portion connecting the first scan connection horizontal portion and the first scan line and extending in the first direction, wherein the first sensing connection line includes a first sensing connection horizontal portion connected to the first sensing output transistor and extending in the second direction and a first sensing connection vertical portion connecting the first sensing connection horizontal portion and the first sensing line and extending in the first direction, wherein the second sensing connection line includes a second sensing connection horizontal portion connected to the second sensing output transistor and extending in the second direction and a second sensing connection vertical portion connecting the second sensing connection horizontal portion and the second sensing line and extending in the first direction, and wherein the second scan connection line includes a second scan connection horizontal portion connected to the second scan output transistor and extending in the second direction and a second scan connection vertical portion connecting the second scan connection horizontal portion and the second scan line and extending in the first direction.

4. The display device of claim 3, wherein the first scan connection vertical portion crosses and overlaps the first sensing connection horizontal portion, and wherein the second sensing connection vertical portion crosses and overlaps the second scan connection horizontal portion.

5. The display device of claim 3, wherein the first scan connection horizontal portion crosses and overlaps the first sensing connection vertical portion, and wherein the second sensing connection horizontal portion crosses and overlaps the second scan connection vertical portion.

6. The display device of claim 3, wherein the first scan connection horizontal portion includes a first contact portion crossing and contacting the first scan connection vertical portion and a first overlap portion crossing and overlapping the first sensing connection vertical portion, and wherein the first overlap portion is positioned in the second direction from the first contact portion.

7. The display device of claim 6, wherein the first sensing connection horizontal portion includes a second overlap portion crossing and overlapping the first scan connection vertical portion, and wherein the second overlap portion is positioned in the first direction from the first contact portion.

8. The display device of claim 7, wherein the first sensing connection horizontal portion further includes a second contact portion crossing and contacting the first sensing connection vertical portion, and wherein the second contact portion is positioned in the first direction from the first overlap portion and positioned in the second direction from the second overlap portion.

9. The display device of claim 3, wherein the second sensing connection horizontal portion includes a third contact portion crossing and contacting the second sensing connection vertical portion and a third overlap portion crossing and overlapping the second scan connection vertical portion, and wherein the third overlap portion is positioned in the second direction from the third contact portion.

10. The display device of claim 9, wherein the second scan connection horizontal portion includes a fourth overlap portion crossing and overlapping the second sensing connection vertical portion, and wherein the fourth overlap portion is positioned in the first direction from the third contact portion.

11. The display device of claim 10, wherein the second scan connection horizontal portion further includes a fourth contact portion crossing and contacting the second scan connection vertical portion, and wherein the fourth contact portion is positioned in the first direction from the third overlap portion and positioned in the second direction from the fourth overlap portion.

12. The display device of claim 3, wherein the first scan connection horizontal portion is disposed on a same layer as the first scan line, wherein the first sensing connection horizontal portion is disposed on a same layer as the first sensing line, wherein the second sensing connection horizontal portion is disposed on a same layer as the second sensing line, and wherein the second scan connection horizontal portion is disposed on a same layer as the second scan line.

13. The display device of claim 3, wherein each of the first pixel and the second pixel includes:
a lower electrode disposed on a substrate;
an active layer disposed on the lower electrode;
a gate electrode disposed on the active layer; and
a source electrode and a drain electrode connected to the active layer.

14. The display device of claim 13, wherein each of the first scan connection horizontal portion, the first sensing connection horizontal portion, the second sensing connection horizontal portion, and the second scan connection horizontal portion is disposed on a same layer as the source electrode and the drain electrode.

15. The display device of claim 13, wherein each of the first scan connection vertical portion, the first sensing connection vertical portion, the second sensing connection vertical portion, and the second scan connection vertical portion is disposed on a same layer as the lower electrode.

16. The display device of claim 3, wherein the first scan connection horizontal portion directly contacts the first scan connection vertical portion, wherein the first sensing connection horizontal portion directly contacts the first sensing connection vertical portion, wherein the second sensing connection horizontal portion directly contacts the second sensing connection vertical portion, and wherein the second scan connection horizontal portion directly contacts the second scan connection vertical portion.

17. The display device of claim 3, wherein the first scan line directly contacts the first scan connection vertical portion, wherein the first sensing line directly contacts the first sensing connection vertical portion, wherein the second scan line directly contacts the second scan connection vertical portion, and wherein the second sensing line directly contacts the second sensing connection vertical portion.

18. The display device of claim 3, wherein a length of the first scan connection vertical portion in the first direction is equal to a length of the second sensing connection vertical portion in the first direction.

19. The display device of claim 3, wherein a length of the first sensing connection vertical portion in the first direction is equal to a length of the second scan connection vertical portion in the first direction.

20. The display device of claim 3, wherein a length of the first scan connection horizontal portion in the second direction, a length of the first sensing connection horizontal portion in the second direction, a length of the second sensing connection horizontal portion in the second direction, and a length of the second scan connection horizontal portion in the second direction are equal to each other.

* * * * *